United States Patent
Twiss et al.

(10) Patent No.: US 6,610,922 B1
(45) Date of Patent: Aug. 26, 2003

(54) APPARATUS FOR SECURING AN ELECTROMAGNETIC SHIELD IN A CONDUCTIVE CASING

(75) Inventors: Robert G. Twiss, Chapel Hill, NC (US); Norman L. Creekmore, Raleigh, NC (US); Frederic M. Kozak, Raleigh, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/027,757

(22) Filed: Dec. 20, 2001

(51) Int. Cl.$^7$ ................................................. H05K 9/00
(52) U.S. Cl. ................................ 174/35 MS; 454/184
(58) Field of Search ...................... 174/35 MS, 35 R; 361/816, 818, 800; 454/184

(56) References Cited

U.S. PATENT DOCUMENTS

| | | | |
|---|---|---|---|
| 3,546,359 A | 12/1970 | Ciccarelli et al. | 174/35 |
| 3,580,981 A | 5/1971 | Lamp et al. | 174/35 |
| 4,616,101 A | 10/1986 | Veerman et al. | 174/35 |
| 4,851,608 A | 7/1989 | Seip | 174/35 |
| 4,879,434 A | 11/1989 | Assel et al. | 174/35 R |
| 5,007,946 A | 4/1991 | Babini | 55/501 |
| 5,032,689 A | 7/1991 | Halligan et al. | 174/35 R |
| 5,232,478 A | 8/1993 | Farris | 55/104 |
| 5,401,914 A | 3/1995 | Crran et al. | 174/356 |
| 5,431,974 A | 7/1995 | Pierce | 428/45 |
| 5,766,285 A | 6/1998 | Killman | 55/385.6 |
| 5,827,340 A | 10/1998 | Fiske | 55/385.6 |
| 5,910,639 A | 6/1999 | Kunkel | 174/35 MS |
| 5,928,026 A | * 7/1999 | Clements et al. | 454/184 |
| 5,928,076 A | 7/1999 | Clements et al. | 454/184 |
| 5,935,282 A | 8/1999 | Lin | 55/385.6 |
| 6,018,125 A | 1/2000 | Collins et al. | 174/35 R |
| 6,033,453 A | 3/2000 | Weddell, III | 55/493 |
| 6,072,119 A | 6/2000 | Nicolai et al. | 174/35 R |
| 6,110,245 A | 8/2000 | Schlag et al. | 55/385.6 |
| 6,171,357 B1 | 1/2001 | Guttmann | 55/385.7 |
| 6,185,097 B1 | 2/2001 | Behl | 361/695 |
| 6,211,458 B1 | 4/2001 | Mitchell et al. | 174/35 R |
| 6,252,161 B1 | 6/2001 | Hailey et al. | 174/35 R |
| 6,284,010 B1 | 9/2001 | Rehmert | 55/385.6 |

OTHER PUBLICATIONS

"Universal Air Filter Introduces Flex–Frame Air Filter for Electronics Equipment," *Universal Air FilterCo.*, web page press release at http://www.u f.c m/news–20.htm, dated Oct. 4, 2001, one page.

"Air Filters with EMI Shielding for Medical Enclosures," *Universal Air Filter Co.*, web page press release at http://www.u f.c m/news–20.htm, dated Oct. 4, 2001, one page.

"New Windowpane Air Filters Introduced for Telecom Electronics," *Universal Air Filter Co.*, web page press release at http://www.u f.c m/news–22.htm, dated Oct. 4, 2001, one page.

"Product Selection Guide," *Spira Manufacturing*, web page at http://www.spir –emi.c m/ r ducts.htm, dated Oct. 4, 2001.

* cited by examiner

Primary Examiner—Hung V. Ngo
(74) Attorney, Agent, or Firm—Baker Botts L.L.P.

(57) ABSTRACT

An apparatus for securing an electromagnetic shield in a conductive, casing includes a conductive frame, spring devices on a first edge of the frame that secure an electromagnetic shield in the frame and electrically couple the shield to the frame, and spring devices on a second edge of the frame that secure the frame in an aperture through a conductive casing and electrically couple the frame to the casing. An electromagnetic shielding apparatus includes a conductive frame, an electromagnetic shield of conductive material formed into cells, and spring devices on the frame that hold the shield in the frame and electrically couple the shield to the frame.

26 Claims, 3 Drawing Sheets

APPARATUS FOR SECURING AN ELECTROMAGNETIC SHIELD IN A CONDUCTIVE CASING

TECHNICAL FIELD OF THE INVENTION

This invention relates in general to electromagnetic shielding for electronic components, and more particularly to an apparatus for securing an electromagnetic shield in a conductive casing.

BACKGROUND OF THE INVENTION

As demand for higher speed telecommunication and networking equipment increases, devices must include faster processors, system clocks, and busses to meet these performance demands. As the speed of components increases, the components produce more intense and higher frequency electromagnetic (EM) emissions. In order to comply with regulatory standards and prevent interference with the operation of other devices, these EM emissions must be substantially contained. The emissions may be contained by a conductive casing, but apertures in the conductive casing are necessary to allow sufficient air flow to cool electronic components during operation. As long as apertures are sufficiently small, the conductive casing can still contain electromagnetic emissions from the components. However, as the frequency of electromagnetic emissions increases, the aperture size must be reduced. As a result, it can become difficult to block electromagnetic emissions while still allowing sufficient air flow.

SUMMARY OF THE INVENTION

In accordance with the teachings of the present invention, the disadvantages and problems associated with shielding against high frequency electromagnetic emissions have been substantially reduced or eliminated. In particular, the need for screws, conductive gaskets, conductive glue, and other equipment to secure electromagnetic shields into apertures has been greatly reduced.

In one embodiment, an apparatus for securing an electromagnetic shield includes a conductive frame, first spring devices along a first edge of the conductive frame that secure an electromagnetic shield in the frame and couple the electromagnetic shield to the frame electrically, and second spring devices along a second edge of the frame that secure the conductive frame in an aperture in a conductive casing and couple the conductive frame to the casing electrically. The conductive frame may be formed from a flexible metal alloy plated with a conductive, corrosion-resistant material. The frame may also include an inner lip for securing the electromagnetic shield in position, and an outer lip for securing the frame in an aperture through a conductive casing.

In another embodiment of the present invention, an electromagnetic shielding apparatus includes a conductive frame, an electromagnetic shield made of conductive material formed into cells, and spring devices along a first edge of the frame to secure the electromagnetic shield within the frame and couple the frame to the shield electrically. The frame may be formed from a flexible metal alloy and plated with a conductive, corrosion-resistant material. In a particular embodiment, the electromagnetic shield is formed from aluminum or steel, and each cell of the electromagnetic shield is approximately 0.08 inches across.

Important technical advantages of certain embodiments of the present invention include electromagnetic shielding that allows sufficient air flow to cool shielded components. In particular, certain embodiments of the present invention allow shielding of an aperture in a conductive casing while allowing air flow through the aperture. This allows shielding of high frequency electromagnetic emissions without substantially interfering with air flow.

Another important technical advantage includes using flexible metal in the conductive frame. Using flexible metal allows the frame to be fitted into apertures more easily. Since the material of the frame is flexible, portions of the frame can be formed into spring devices. Since the spring devices can be made integral to the frame, the frame can be manufactured as a single piece, making the device even more easy to manufacture and use.

Particular embodiments of the present invention may include some, all, or none of the technical advantages described above. Additional technical advantages of various embodiments of the invention will be readily apparent to one skilled in the art. The technical advantages of the present invention can be better understood by reference to the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
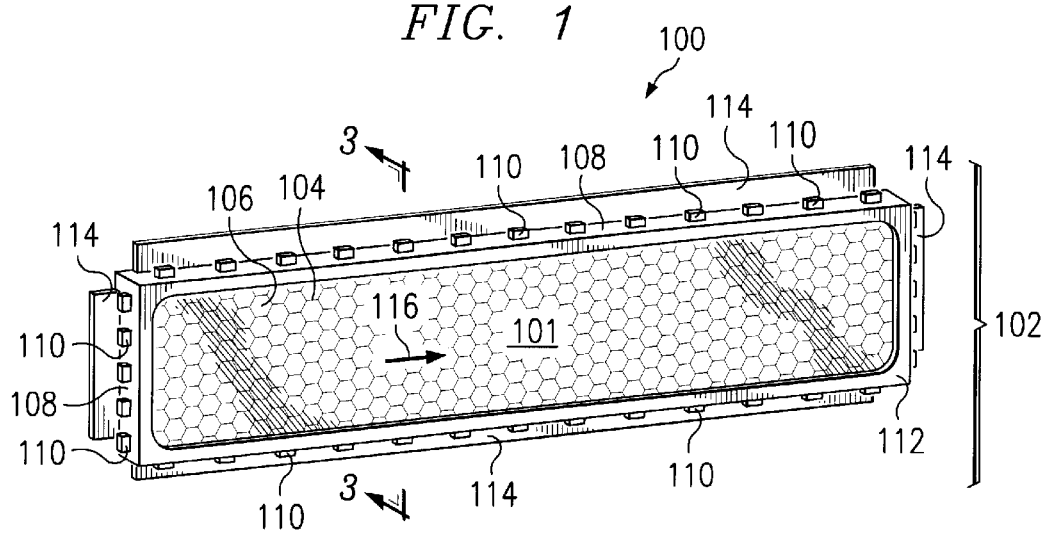
FIG. 1 illustrates an electromagnetic shielding apparatus in accordance with the present invention.

FIG. 1 shows an apparatus for electromagnetic shielding 100 that includes an electromagnetic shield 101 and a conductive frame 102 enclosing the electromagnetic shield. Although shielding apparatus 100 is shown as rectangular, it is understood that apparatus 100 may take any appropriate shape for any aperture in a conductive casing. In particular, frame 102 may be modified to hold electromagnetic shields 101 of different shapes.

Electromagnetic shield 101 comprises a conductive material formed into a plurality of cells 104. Electromagnetic shield 101 is shown as conductive material formed into hexagonally shaped cells 104 in a honeycomb configuration. Cells, however, can be circular, rectangular, triangular, polygonal, or any other appropriate shape. The material of electromagnetic shield 101 can be a conductive metal or metal alloy such as aluminum or steel, or may be a non-conductive material, such as plastic, that has been coated with a conductive material, such as bright tin.

Electromagnetic shield 101 includes openings 106 that allow air to flow through electromagnetic shield 101. The size of openings 106 may be determined by the frequency of electromagnetic emissions to be attenuated by electromagnetic shield 101. In particular, as the frequency of electromagnetic emissions becomes higher, openings 106 must be smaller in order to effectively attenuate the electromagnetic emissions.

Conductive frame 102 holds electromagnetic shield 101 in place. Conductive frame 102 may be formed of any conductive material, including a metal, metal alloy, or a nonconductive material plated or otherwise coated with a conductive material. Conductive frame 102 may also be plated or otherwise coated with a material that increases conductivity and/or prevents corrosion, such as bright tin. In a particular embodiment, conductive frame 102 may be formed from a flexible metal alloy that yields slightly under pressure, allowing frame 102 to fit into apertures more easily. In the embodiment shown, conductive frame 102 includes an outer edge 108, spring devices 110 along outer edge 102, and outer lips 114.

Spring devices 110 along outer edge 108 of frame 102 secure conductive frame 102 in an aperture through a conductive casing. Spring devices 110 may include spring tabs, spring clips, or any other device capable of bringing a mechanical bias to bear against a portion of a conductive casing into which frame 102 is secured. When frame 102 is composed of flexible metal, spring devices 110 integral to frame 102 can be formed, allowing frame 102 to be manufactured as a single piece. When securing frame 102 in a conductive casing, spring devices 110 also electrically couple frame 102 to the conductive casing, allowing frame 102 and conductive casing to share a ground plane. This preserves the effectiveness of electromagnetic shielding apparatus 100 as a portion of a Faraday cage formed by the shielding apparatus 100 and the conductive casing, as well as preventing stray electric currents from developing in the casing.

Frame 102 also includes an inner lip 112 and an outer lip 114 divided into portions. Inner lip 112 helps to secure shield 101 in place within frame 102. Outer lips 114 secure frame 102 against a conductive casing to hold frame 102 in place. In a particular embodiment, spring device 110 may press conductive casing flushly against outer lips 114 to provide mechanical stability for frame 102. However, it is understood that neither inner lip 112 nor outer lip 114 may be necessary to secure frame 102 in place or to hold electromagnetic shield 101 within frame 102. Instead, for example, spring devices 110 may be designed to hold frame 102 in place without the need for outer lips 114.

Figure 2A:
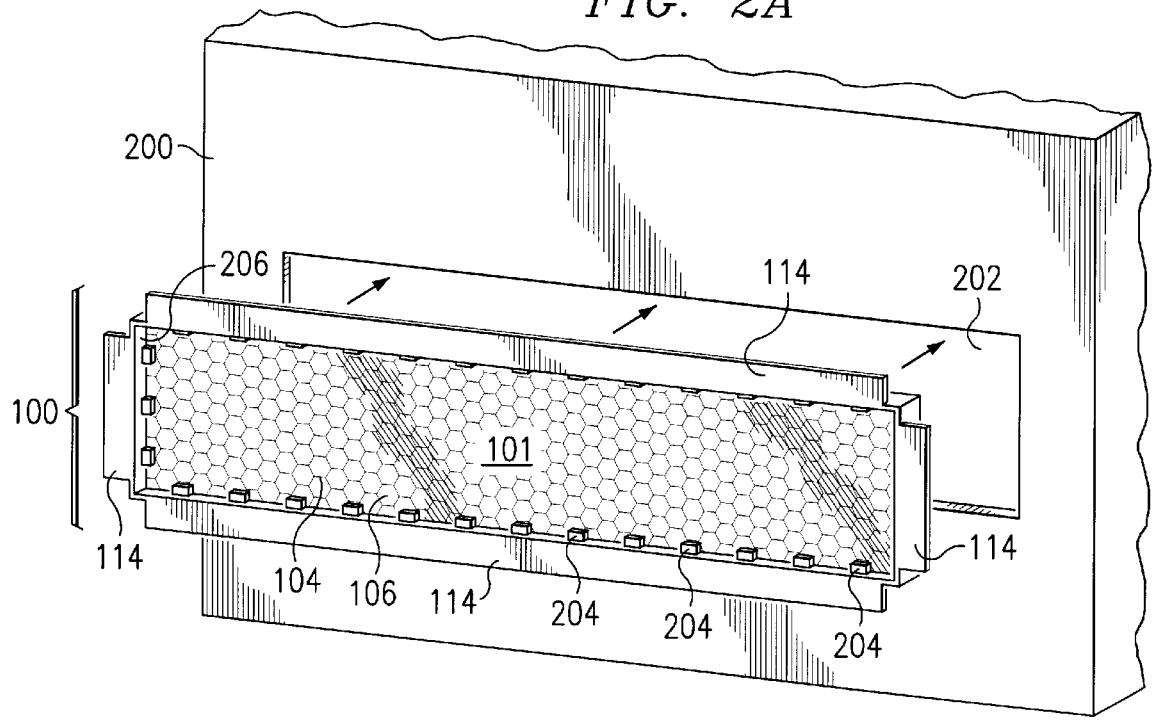
FIG. 2A shows another perspective of the electromagnetic shielding apparatus, illustrating how the apparatus is installed in an aperture in a conductive casing.

FIG. 2A shows the electromagnetic shielding apparatus 100 from the other side. FIG. 2A also depicts how shielding apparatus 100 may be inserted into an aperture 202 in a casing 200. Casing 200 represents suitable material or combination of materials formed into any suitable shape for attenuating electromagnetic emissions. Casing 200 is typically formed from a conductive material, and the description below will primarily focus on a conductive casing 200. However, it is understood that casing 200 may be formed of any suitable material for attenuating electromagnetic emissions, and may include suitable non-conductive materials in addition to or in replacement of conductive materials.

From the perspective in FIG. 2A, a second set of spring devices 204 along the inner edge 206 of frame 102 are visible. The second set of spring devices 204 may be of the same type as spring devices 110, or may be formed differently. Generally, spring devices 204 may include spring clips, spring tabs, or any other suitable device for bringing a mechanical bias to bear against electromagnetic shield 101. In a particular embodiment, spring devices 204 press electromagnetic shield 101 flushly against inner lip 112 of frame 102. Spring devices 204 may be integral to frame 102 when frame 102 is formed from flexible metal. Spring devices 204 also electrically couple frame 102 to electromagnetic shield 101, improving the ability of electromagnetic shield 101 to perform electromagnetic shielding when frame 102 is coupled to conductive casing 200 electrically. In the embodiment shown, outer lips 114 press against the outer face of conductive casing 200 to help establish an electrical connection between frame 102 and conductive casing 200.

In operation, electromagnetic shield 101 is pressed into frame 102, placing spring devices 204 into a compressed state. Electromagnetic shield 101 slides past spring devices 204, which assume an uncompressed state once electromagnetic shield 101 clears spring devices 204. In their uncompressed state, spring devices 204 press electromagnetic shield 101 against inner lip 112 and electrically couple electromagnetic shield 101 to frame 102. Frame 102 is pressed into aperture 202 of conductive casing 200, placing spring devices 110 into a compressed state. Frame 102 slides into aperture 202, and when conductive casing 200 clears spring devices 110, spring devices 110 assume an uncompressed state. In their uncompressed state spring devices 110 press conductive casing against outer lip 114 and electrically couple frame 102 to conductive casing 200.

Figure 2B:
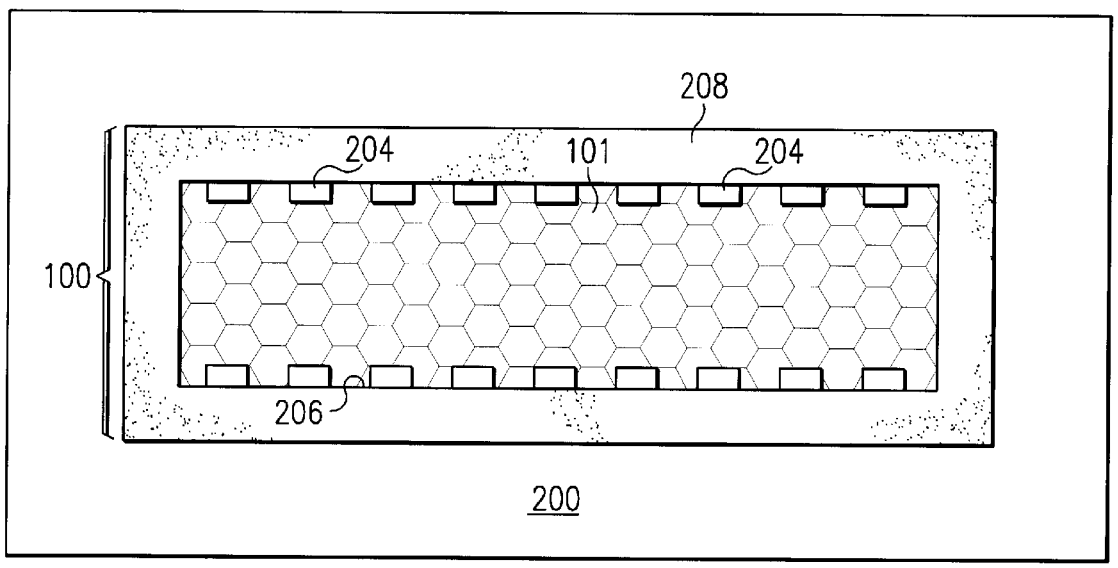
FIG. 2B shows the electromagnetic shielding apparatus as installed in the conductive casing.

FIG. 2B illustrates frame 102 as installed in casing 200. An adhesive label 208 affixed to frame 102 and conductive casing 200 helps to secure frame 102 in aperture 202. Adhesive label is sized to avoid obscuring shield 101, so that adhesive label 208 does not interfere with airflow through shield 101. Adhesive label 208 may also serve aesthetic purposes as well, such as hiding the edges of frame to create a smoother overall appearance for casing 200, and may be decorated with various patterns or colors to achieve any suitable appearance for label 208.

In a particular embodiment, adhesive label 208 is made of a conductive material and/or conductive adhesive. Accordingly, conductive adhesive label 208 may provide additional electrical coupling between frame 102 and conductive casing 200. Conductive adhesive label 208 also covers the edges of aperture 202 and helps to reduce electromagnetic emissions that might otherwise escape through aperture 202 around the outside edge 108 of frame 102. Conductive adhesive label 208 is particularly useful in this respect when frame 102 is installed in a non-conductive casing 200, because the lack of electromagnetic coupling between frame 102 and casing 200 creates a greater risk that electromagnetic emissions will escape through aperture 202 around the outside edge 108 of frame 102.

Although particular embodiments of frame 102 have been described, numerous variations are possible for one skilled in the art. For example, where reference has been made to structures that are inside or outside frame, it is understood that the structures can take other appropriate positions on frame 102. In certain embodiments, lips 112 and 114 may be omitted from frame 102, divided into sections, or otherwise suitably modified. The described embodiment, therefore, should be taken as an example of one possible variation rather than as an exclusive definition.

Figure 3:
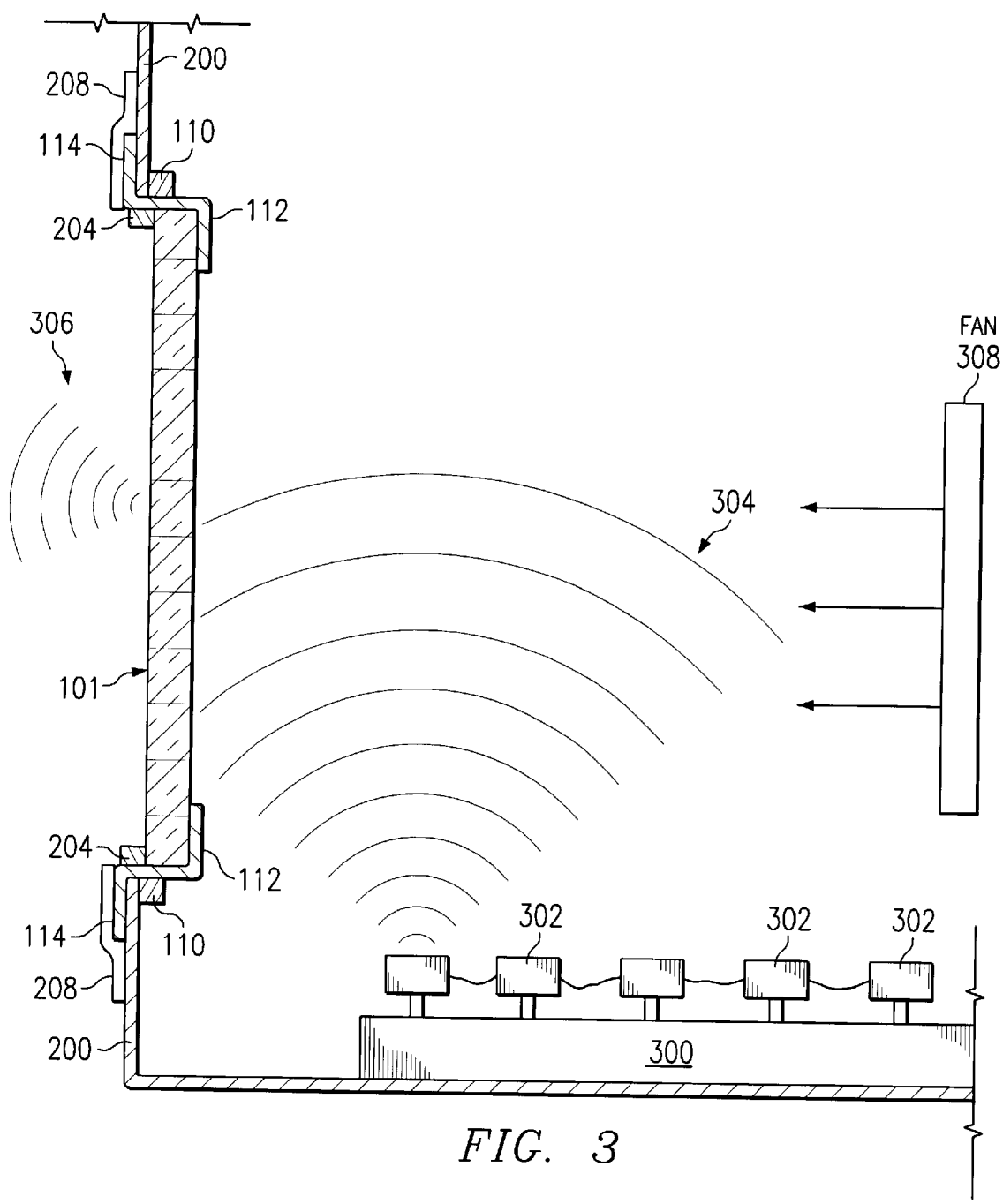
FIG. 3 shows a cut-away of the apparatus as installed in a conductive casing.

FIG. 3 shows a cut-away view of electromagnetic shielding apparatus 100 in aperture 202 of conductive casing 200. The cut-away view is taken through line A—A of FIG. 1 as viewed along direction 116. In the depicted embodiment, conductive casing 200 encloses components 302 on a nonconductive base 300. Nonconductive base 300 allows components 302 to operate without electrical signals from components 302 propagating into conductive casing 200. During operation, components 302 radiate electromagnetic emissions 304., The speed of operation of components 302 influences both the intensity and the frequency of electromagnetic emissions 304. The material of casing 200 is selected so that casing 200 attenuates electromagnetic emissions. However, electromagnetic emissions would escape through aperture 200 if not for electromagnetic shield 100. As shown, electromagnetic emissions 304 inside conductive casing 200 are substantially attenuated by electromagnetic shield 101 such that only a small portion 306 of electromagnetic emissions can escape conductive casing 200. Fan 308 in casing provides air flow to cool components 302. Because of the openings 106 in electromagnetic shield 101 the air flow through aperture 202 is sufficient to cool components 302 during operation.

It is important that the edges of aperture 202 are completely blocked by conductive material. Otherwise, electromagnetic emissions 304 could escape around the edges of electromagnetic shield 101. For this reason, spring devices 110 should secure frame 102 as closely as possible to the edges of aperture 202, and similarly spring devices 204 should hold electromagnetic shield 101 securely in frame 102. Inner lip 112 and outer lip 114 can assist in tightly sealing aperture 202 with conductive material. Inner lip 112, however, should not be so large as to occlude the electromagnetic shield 101, and thereby prevent maximum air flow through shield 101. Using a conductive adhesive label 208 may also provide additional electromagnetic shielding around frame 102.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. An apparatus for securing an electromagnetic shield in a conductive casing, comprising:
   a conductive frame having an outer lip, a first edge and a second-edge;
   a plurality of first spring devices along the first edge of the conductive frame operable to secure an electromagnetic shield within the conductive frame, the electromagnetic shield comprising a conductive material formed into a plurality of cells, each cell enclosing an opening through the electromagnetic shield, the first spring devices further operable to electrically couple the electromagnetic shield to the conductive frame electrically;
   a plurality of second spring devices along the second edge of the conductive frame operable to secure the conductive frame in an aperture in a conductive casing and further operable to engage the outer lip of the frame flushly against an outside face of the conductive casing such that the outer lip is disposed around the aperture and to electrically couple the conductive frame to the conductive casing.

2. The apparatus of claim 1, wherein the conductive frame comprises a flexible metal alloy.

3. The apparatus of claim 2, wherein the flexible metal alloy is selected from beryllium-copper and spring steel.

4. The apparatus of claim 2, wherein the first and second spring devices are integral to the conductive frame.

5. The apparatus of claim 1, wherein:
   the conductive frame further comprises an outer lip; and
   the second spring devices are further operable to engage the outer lip flushly with a portion of the conductive casing.

6. The apparatus of claim 1, wherein the outer lip is divided into portions.

7. The apparatus of claim 6, wherein:
   the frame comprises a rectangular frame; and
   each portion of the outer lip is disposed along one side of the rectangular frame.

8. The apparatus of claim 1, wherein:
   the first spring devices are further operable to assume a compressed state when the electromagnetic shield is pressed into the conductive frame; and
   the first spring devices are further operable to assume an uncompressed state after the electromagnetic shield has cleared the first spring devices.

9. The apparatus of claim 1, wherein:
   the second spring devices are further operable to assume a compressed state when the conductive frame is pressed into the aperture of the conductive casing; and
   the second spring devices are further operable to assume an uncompressed state after a portion of the conductive casing has cleared the second spring devices.

10. The apparatus of claim 1, further comprising an adhesive label, the adhesive label operable to electrically couple the conductive frame to the conductive casing, the adhesive label further operable to attenuate electromagnetic emissions passing through the aperture around the frame.

11. The apparatus of claim 1, wherein:
    the conductive material of the electromagnetic shield is selected from aluminum and steel; and
    each cell of the electromagnetic shield is approximately 0.08 inches across.

12. An electromagnetic shielding apparatus, comprising:
    a conductive frame comprising an inner lip;
    an electromagnetic shield comprising a conductive material formed into a plurality of cells, each cell enclosing an opening through the electromagnetic shield; and
    a plurality of spring devices integral to the conductive frame operable to secure the electromagnetic shield within the conductive frame flushly against the inner lip and further operable to couple the conductive frame to the electromagnetic shield electrically.

13. The apparatus of claim 12, wherein the conductive frame comprises a flexible metal alloy.

14. The apparatus of claim 13, wherein the flexible metal alloy is selected from beryllium-copper alloy and spring steel.

15. The apparatus of claim 12, wherein:
    the spring devices are further operable to engage a portion of the electromagnetic shield flushly with the inner lip such that a substantial portion of the cells are not occluded by the inner lip.

16. The apparatus of claim 12, wherein:
    the conductive material of the electromagnetic shield is selected from aluminum and steel; and
    the openings in the electromagnetic shield are approximately 0.08 inches across.

17. The apparatus of claim 12, wherein the apparatus is securable in an aperture in a conductive casing and operable to couple to the conductive casing electrically.

18. The apparatus of claim 12, wherein the cells of the electromagnetic shield have a size selected to prevent a substantial portion of electromagnetic emissions of a selected frequency from passing through the shield.

19. The apparatus of claim 18, wherein the number of cells of the electromagnetic shield is selected to allow sufficient airflow to cool electrical components within the casing during operation of the components.

20. The apparatus of claim 12, further comprising an adhesive label operable to secure the frame within an aperture in a casing and further operable to attenuate electromagnetic emissions passing through the aperture around the frame.

21. A method for installing an electromagnetic shield in an aperture of a conductive casing, comprising:

obtaining a conductive frame having an outer lip, a plurality of first spring devices along a first edge of the frame and a plurality of second spring devices along a second edge of the frame;

pressing an electromagnetic shield comprising a conductive material formed into a plurality of cells, each cell enclosing an opening in the electromagnetic shield, into the conductive frame such that the first spring devices assume a compressed state;

sliding the electromagnetic shield past the first spring devices so that the spring devices assume an uncompressed state, the first spring devices in the uncompressed state operable to secure the electromagnetic shield in the conductive frame and to electrically couple the electromagnetic shield to the conductive frame;

pressing the conductive frame into an aperture of a conductive casing such that the second spring devices assume a compressed state;

sliding the conductive frame into the aperture such that the second spring devices assume an uncompressed state, the second spring devices in the uncompressed state operable to secure the conductive frame in the aperture and further operable to engage the outer lip flushly against an outside face of the conductive casing such that the outer lip is disposed around the aperture and to electrically couple the conductive frame to the conductive casing.

22. The method of claim 21, wherein:

the conductive frame is formed from a flexible metal alloy;

the first and second spring devices comprise the conductive material of the frame; and the first and second spring devices are integral to the conductive frame and comprise protuberances from the conductive frame.

23. The method of claim 21, further comprising affixing an adhesive label to the frame, the adhesive label operable to:

secure the frame within the aperture; and attenuate electromagnetic emissions passing through the aperture around the frame.

24. The method of claim 21, wherein the outer lip is divided into portions.

25. The method of claim 24, wherein:

the frame comprises a rectangular frame; and each portion of the outer lip is disposed along one side of the rectangular frame.

26. An electromagnetic shielding apparatus, comprising:

a conductive frame having an outer lip;

means for securing an electromagnetic shield within the conductive frame, the electromagnetic shield comprising a conductive material formed into a plurality of cells, each cell enclosing an opening through the electromagnetic shield, wherein the means for securing the electromagnetic shield are operable to electrically couple the electromagnetic shield to the frame; and means for securing the conductive frame in an aperture in a conductive casing, wherein the means for securing the conductive frame are operable to engage the outer lip of the frame flushly against an outside face of the conductive casing such that the outer lip is disposed around the aperture and to electrically couple the conductive frame to the conductive casing.

\* \* \* \* \*